United States Patent
Radziun et al.

(10) Patent No.: US 6,375,147 B1
(45) Date of Patent: Apr. 23, 2002

(54) VIBRATION ISOLATION APPARATUS FOR MR IMAGING SYSTEM

(75) Inventors: Michael J. Radziun; Scott T. Mansell, both of Waterford; David E. Dean, Hartland; Dewain A. Purgill, Waukesha, all of WI (US)

(73) Assignee: General Electric Company, Waukesha, WI (US)

( * ) Notice: Subject to any disclaimer, the term of this patent is extended or adjusted under 35 U.S.C. 154(b) by 0 days.

(21) Appl. No.: 09/394,853

(22) Filed: Sep. 13, 1999

(51) Int. Cl.$^7$ ............................. F16M 1/00; F16M 13/00
(52) U.S. Cl. ........................................ 248/638; 248/550
(58) Field of Search ................................ 248/638, 637, 248/550; 324/319, 320, 321

(56) References Cited

U.S. PATENT DOCUMENTS

| | | | | |
|---|---|---|---|---|
| 3,582,027 A | * | 6/1971 | Hackbarth | 248/550 |
| 3,589,655 A | * | 6/1971 | Hackbarth | 248/550 |
| 3,836,134 A | * | 9/1974 | Lowe et al. | 267/152 |
| 4,571,568 A | * | 2/1986 | Grangereau | 335/299 |
| 4,591,790 A | * | 5/1986 | Takahashi | 324/318 |
| 5,016,638 A | * | 5/1991 | Hsieh | 600/410 |
| 5,573,220 A | * | 11/1996 | Whittaket et al. | 248/638 |
| 5,765,800 A | * | 6/1998 | Watanabe et al. | 248/550 |
| 5,812,420 A | * | 9/1998 | Takahashi | 346/508 |
| 5,876,012 A | * | 3/1999 | Haga et al. | 248/550 |
| 5,881,987 A | * | 3/1999 | Hara | 248/550 |
| 5,996,960 A | * | 12/1999 | Krajec | 248/638 |
| 6,036,162 A | * | 3/2000 | Hayashi | 248/550 |
| 6,038,013 A | * | 3/2000 | Ohsaki | 355/53 |
| 6,043,653 A | * | 3/2000 | Takamori et al. | 324/309 |
| 6,169,404 B1 | * | 1/2001 | Eckels | 324/320 |
| 6,231,442 B1 | * | 4/2001 | Ivers et al. | 248/550 |

FOREIGN PATENT DOCUMENTS

| EP | 1085336 A2 | * | 3/2001 |
|---|---|---|---|
| JP | 2001145611 | * | 5/2001 |

* cited by examiner

Primary Examiner—Anita King
Assistant Examiner—Naschica S Morrison
(74) Attorney, Agent, or Firm—Jenkens & Gilchrist

(57) ABSTRACT

Apparatus which provides a barrier for vibrational energy between an MR imaging system and an associated horizontal support surface includes a stiff platform of substantial mass, which is disposed to carry the entire weight of the MR imaging system. The apparatus further includes a number of vibration isolation elements positioned to support the platform and the MR imaging system upon the horizontal support surface. Each of the isolation elements comprises an enclosure containing pressurized air which is disposed to dampen vibrations, in order to oppose the transmission of vibrations between the platform and the support surface. An air pressure regulator is coupled to respective isolation elements to maintain specified air pressure levels therein, in order to support the platform in selected spaced-apart orientation with respect to the horizontal support surface.

22 Claims, 3 Drawing Sheets

VIBRATION ISOLATION APPARATUS FOR MR IMAGING SYSTEM

BACKGROUND OF THE INVENTION

The invention disclosed and claimed herein is generally directed to an arrangement for substantially reducing the transfer or transmission of mechanical vibrations between a magnetic resonance (MR) imaging system and the floor, walls and other structure of the building environment in which the MR system is sited. More particularly, the invention is directed to an arrangement of the above type for reducing transmission of vibrations in both directions, that is, from the MR system to surrounding structure, and also from surrounding structure to the MR system. The invention may include means for determining whether vibrations present at a site, if applied to the MR system, would adversely affect images produced thereby.

As is well known by those of skill in the art, MR imaging systems employ electrically excited coils to impose time varying magnetic fields on the static primary $B_0$ field produced by the system main magnet. The imposed fields have associated currents which flow through conductors. Since these currents occur within a magnetic field, corresponding forces are applied to the conductors, which cause dynamic motions to be propagated throughout the MR system. Moreover, typical current waveforms contain repetitive pulses with fast transitions that produce vibrational energy within the audio frequency range. This causes the MR imaging system or scanner to radiate sound pressure waves, which may be very disturbing to both patients and system operators. In addition, MR systems now produce significantly higher levels of noise which is not related to the imaging or scanning process. The increased non-scanning noise levels result from the use of more powerful cryocoolers to cool the main magnet.

Both the scanning related and non-scanning related vibrational energy produced by an MR scanner may be transmitted through the base of the scanner into the floor or other horizontal surface which supports the scanner at the site of use, such as a hospital or other health care facility. The vibrations may be transferred from the supporting floor to adjacent building structure, and then be propagated therethrough to adjoining rooms, where it is radiated at levels which exceed allowable noise levels. Such structure-born acoustic noise is of increasing concern, as MR scanners become smaller and lighter and can thereby be installed and used in closer proximity to non-MR areas, such as patient rooms and staff offices. It is anticipated that regulatory limits on the allowable acoustic noise levels in such areas will become even more restrictive in the future.

Vibrations in the building structure adjacent to an MR scanner, which are transmitted into the base of the scanner through the supporting floor, are also of concern to the designers and users of MR imaging systems. Typical sources of such vibrations include fans and other air moving equipment, and motor/generator sets. Motion of system components resulting from these vibrations may induce eddy currents which disrupt the delicate frequency tuning involved in image generation/reconstruction. More particularly, the transmitted vibrations may cause relative motions between the various subassemblies of an MR system, such as the main magnet coils and thermal shields. Since these motions cause electrically conductive paths to move with respect to a magnetic field, they induce eddy currents, which in turn cause corresponding changes in the net magnetic field. Typical image degradation artifacts include phase ghosts, which are caused when the time varying magnetic fields induce unbalanced phase shifts in the precession of the RF excited molecules.

Efforts to control the flow or transfer of vibrational energy between an MR scanner and its support surface, in both directions, have encountered a number of complicating factors. Such vibrational energy tends to be divided between two different frequency ranges. Also, there is a large variation in structural characteristics of different MR sites. For example, the transmission of vibration tends to be much different for a scanner installed on a concrete slab at grade level than for a scanner mounted in a mobile van. Accordingly, data pertaining to the transfer of vibrational energy at one type of site would not be particularly relevant for a different type of site.

In the past, one approach to reducing adverse effects of vibrational energy flowing into an MR scanner was to design scanners so that they had a low sensitivity to the vibration spectrum which causes image degradation. Typically, such spectrum includes frequencies of 50 Hz and below. However, such low sensitivity requires very stiff attachment of all conductive parts of the MR scanner, and tends to have a number of undesirable consequences, such as increased cryogen consumption.

SUMMARY OF THE INVENTION

The invention is generally directed to apparatus for providing vibration isolation between an MR imaging system and an associated horizontal support surface, such as the floor in a hospital or other facility in which the MR imaging system is set up for use. The apparatus comprises a stiff platform of substantial mass which is provided with a bearing surface disposed to carry the entire weight of the MR imaging system. For example, the platform may have a mass which is approximately equal to the entire mass of the MR imaging system. The dimensions of the bearing surface are sufficiently large to accommodate the entire MR system "footprint", that is, the silhouette of the underside thereof. The apparatus further comprises a number of vibration isolation elements positioned to support the platform and the MR imaging system upon the horizontal support surface. Each of the isolation elements comprises an air-tight enclosure containing air under pressure, and is disposed to dampen vibrations and to thereby oppose the transmission of vibrations between the platform and the support surface. A pressure regulator is coupled to respective isolation elements to maintain specified air pressure levels therein, as required to support the platform in selected spaced-apart relationship above the horizontal support surface. Preferably, each of the isolation elements includes a side wall, such as a cylindrical member, which is formed of resilient material and is provided with an upper load bearing plate disposed to engage the platform. The load bearing plate of a given isolation element is positioned at a height above the support surface which is determined by the air pressure within the given isolation element. Thus, the platform may be maintained at a specified height above the support surface, and in a specified orientation such as a horizontal orientation, by operating the pressure regulator to maintain a specified air pressure level in each of the isolation elements.

In a useful embodiment of the invention, a shaker or other vibration generator is placed on the platform to apply mechanical vibrations of varying amplitudes and frequencies to the MR imaging system. A number of vibration sensors, such as accelerometers, are joined to the MR system to acquire data representing the applied vibrations, as well as the effects thereof on MR imaging. Because of the vibration isolation provided by the platform and the isolation elements, the acquired data will represent only the controlled vibrational energy produced by the vibration generator. Thereafter, when the MR system is set up at a hospital or other site of operation, the system is initially placed directly on the supporting floor. The vibration sensors are then employed to acquire a second set of data, representing vibrational energy at the site which is transmitted to the MR system through the floor. By comparing the two sets of acquired data, the MR system users will be able to readily determine whether the transmitted site vibrations will have a significant effect on images produced by the MR system. If the site vibrations do have such effect, the MR system may be placed on the stiff platform and isolation elements, as described above. Otherwise, it may remain on the floor of the site and be directly supported thereby, so that the platform and isolation elements will not be required.

DETAILED DESCRIPTION OF THE PREFERRED EMBODIMENT

Figure 1:
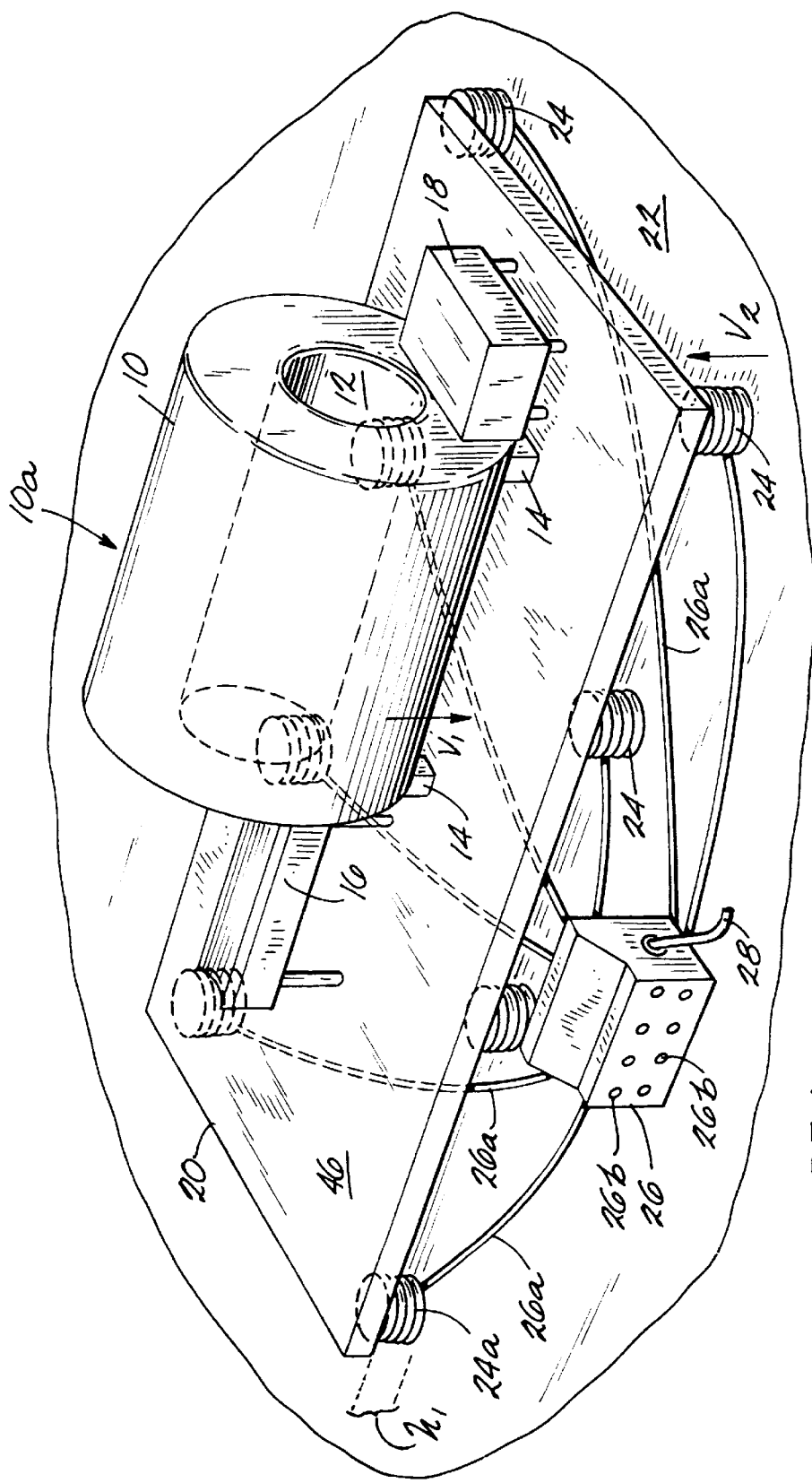
FIG. 1 is a perspective view showing an embodiment of the invention, together with certain components of an MR imaging system.

Referring to FIG. 1, there is shown a cryostat 10, of a type which is commonly used in connection with MR high field imaging systems. As is well known by those of skill in the art, a main magnet (not shown) is positioned around a bore 12 and is contained or enclosed within the cryostat. The cryostat maintains the main magnet at an extremely low temperature. Thus, the main magnet is in a superconductive state, to produce a strong, static $B_0$ magnetic field as required for MR imaging. The cryostat is provided with metal legs 14 to support the cryostat 10 and main magnet on a horizontal surface. As is further well known, cryostat 10 also contains gradient coils (not shown) for generating respective X-, Y-, and Z-gradient fields within the bore 12, as are required for MR imaging. The gradient fields are respectively oriented relative to X-, Y-, and Z-coordinate axes, wherein the Z-axis is typically aligned along the axis of the bore, in parallel relationship with the $B_0$ magnetic field. An RF coil (not shown) is positioned within the gradient coils to transmit and/or receive RF signals in bore 12, as are required for MR imaging.

FIG. 1 further shows a patient couch or support 16 proximate to one end of cryostat 10, and a pedestal 18 proximate to the opposing end thereof. The patient support 16 is used to move a patient reclining thereon (not shown) into and out of the bore 12. Pedestal 18 is employed to support other MR system components (not shown) which are associated with cryostat 10.

As stated above, MR system components contained in cryostat 10, and in particular the gradient coils thereof, can produce significant mechanical vibrations. These vibrations, depicted in FIG. 1 by the arrow $V_1$, may be transmitted through the cryostat legs 14 to a floor or other horizontal support surface which is in direct contact with cryostat 10. As stated further, if the cryostat is located in a hospital or other health care site, the vibrations $V_1$ may be transferred through the floor to other building structure, and become very disturbing to patients and others.

At the same time, vibrations present in the site environment, such as may be produced by mechanical equipment and the like, could be transferred to the cryostat 10 through the supporting floor. Such vibrations, represented in FIG. 1 by the arrow $V_2$, may adversely affect MR images produced within the bore 12 of cryostat 10, as likewise stated above. Accordingly, if cryostat 10 is supported for operation by a floor or other horizontal support surface 22, it may be very desirable to place a barrier therebetween which will prevent transmission of mechanical vibrations in both directions, that is, from cryostat 10 or other MR system components to the surrounding building structure, as well as from the building structure to the MR system components.

Referring further to FIG. 1, there is shown an effective vibration barrier provided by mounting cryostat 10, patient support 16 and pedestal 18, as well as other components of the MR system associated therewith (not shown) on a platform 20. Hereinafter, the cryostat, patient support, pedestal and associated MR components are collectively referred to as MR imaging system 10a. Platform 20 is provided with a top mounting plate 46, or load bearing surface, which is large enough to accomodate respective components of MR system 10a. As described hereinafter in further detail, platform 20 is constructed to be very stiff or rigid, in order to resist vibrations. Also, platform 20 is provided with substantial mass, for example, a mass which is approximately equal to the combined mass of the components of MR system 10a which are respectively supported on platform 20. A number of commonly used MR imaging systems have a mass on the order of 10,000 pounds or more. Thus, the combined mass of platform 20 and MR system 10a, which is on the order of 20,000 pounds or more, will effectively suppress mechanical vibrations in accordance with the well known relationship F=ma. In such relationship F represents force, m represents mass, and a represents acceleration, which is a measure of vibration. Such relationship indicates that the combined mass of the platform and MR system will remain immovable, and therefore will not transmit vibrations, unless a very substantial force is applied thereto.

FIG. 1 shows platform 20 and MR imaging system 10a supported on horizontal support surface 22 by means of vibration isolation elements 24. In one useful embodiment, eight isolation elements 24 are used, wherein four elements are spaced along each side of the platform 20. Each of the isolation elements 24, which are described hereinafter in further detail, comprises an air-tight chamber or enclosure for sealably enclosing a quantity of air under pressure. Each isolation element has a cylindrical side wall, formed of resilient material, and provides both vertical and lateral stability. That is, each isolation element 24 will act to dampen, and to thus oppose transmission of, mechanical vibrations having components of motion which are oriented to be in both vertical and horizontal planes. One useful type of isolation element 24 is sold under the registered trademark STABL-LEVL (SLM series) by Barry Controls, a unit of Applied Power Inc. However, the invention is by no means limited thereto.

As an additional feature, the height of each isolation element 24 is related to the pressure of the air enclosed therein. Thus, the isolation element 24a shown in FIG. 1 has a height $h_1$, when the air pressure therein is $p_1$. It will be seen that by judiciously selecting a specific air pressure level for each of the isolation elements 24, to correpondingly select the heights thereof, the isolation elements 24 can collectively act to support platform 20 above surface 22 in an orientation which is substantially horizontal, even if surface 22 is not at a true horizontal position. Such horizontal orientation of the platform will significantly enhance operation of the MR imaging system 10a.

To maintain each of the isolation elements 24 at their respective specified air pressure levels, a pressure regulator 26, of conventional design, is coupled to each isolation element through a corresponding air line 26a. Regulator 26 receives air, at shop pressure or the like, through a line 28. Regulator 26 is further provided with a number of pressure adjustment elements 26b, each corresponding to one of the isolation elements 24. Each adjustment element 26b is used to set the air pressure which is supplied to the corresponding isolation element 24 to the specified level thereof.

Figure 2:
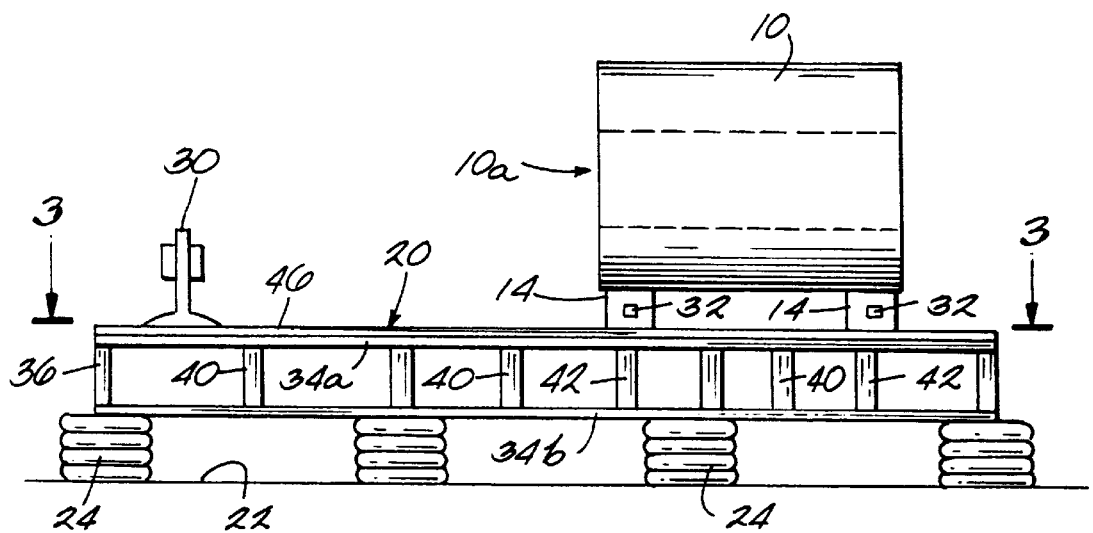
FIG. 2 is an elevational side view showing the embodiment of FIG. 1 together with a vibration generator and vibration sensors.

Referring to FIG. 2, there is shown an electrodynamic shaker 30 positioned on platform 20, in spaced-apart relationship with MR system 10a. Shaker 30 comprises a conventional device of a type which is operable to generate mechanical vibrations of selected variable amplitudes and frequencies. As described above, the combined action of platform 20 and isolation elements 24 effectively isolates MR system 10a from vibrations which are present in a surface 22 or in other adjacent structure of the environment in which the MR system resides. However, the vibrations produced by shaker 30 are readily transmitted to MR system 10a through the stiff platform 20. Thus, by means of platform 20, isolation elements 24, and shaker 30, controlled vibratory motion may be applied to MR system 10a, in order to determine the effects of the vibrations on MR imaging.

In accordance therewith, FIG. 2 further shows accelerometers 32 joined to two of the legs 14 of the MR system. For some vibrational patterns, accelerometers are alternatively attached to all four of the legs. The accelerometers 32 provide data which varies in corresponding relationship with the vibrations applied to MR system 10a. Moreover, the accelerometer data can be correlated with degradations observed in MR images produced by MR system 10a, as vibratory motion of varying amplitude and frequency is controllably applied thereto by shaker 30. For example, a transfer function may be developed by mapping accelerometer response data to corresponding values of a selected MR parameter which is associated with the production of MR images, and which provides a measure of image artifacts or other degradation.

It will be understood that the acquisition of accelerometer data, by means of shaker 30 and accelerometers 32 as described above, can be very useful in preparing a site for a particular MR imaging system. In one embodiment, the MR system is initially set up directly upon the floor or other horizontal surface intended to carry the weight of the system. In such embodiment, the accelerometers 32 remain attached to the MR system. Accordingly, the outputs of the accelerometers will provide an indication of vibrational energy present at the site which is being transferred to the MR system. By monitoring such accelerometer outputs, and by comparing them with the accelerometer output data previously acquired in conjunction with shaker 30, persons setting up the MR system may readily determine whether images produced by the MR system will be adversely affected by the site vibrations. If not, no further action is required in regard thereto. Otherwise, corrective measures may be taken. For example, acoustic baffles or shielding could be placed around a machine, located close to the MR site, which was identified as a principal source of the vibrations. Alternatively, if comparatively simple measures are not available to prevent the vibrations from reaching the MR system, the system could be mounted on the vibration barrier comprising platform 20 and isolation elements 24, as described above.

Figure 3:
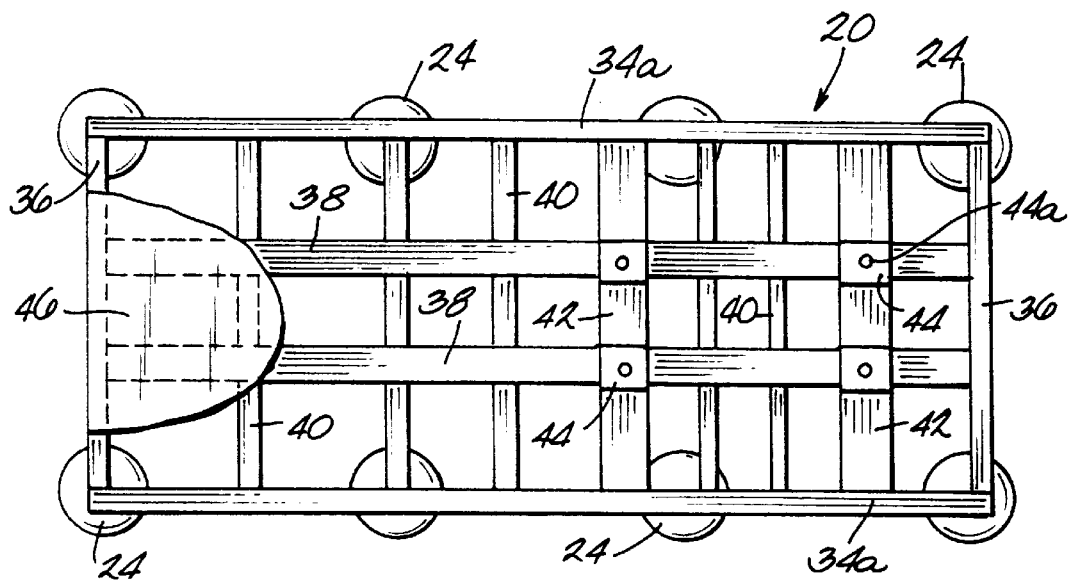
FIG. 3 is an overhead view taken along lines 3—3 of FIG. 2, with only a portion of the top mounting plate thereof being shown.

Referring to FIGS. 2 and 3 together, there is shown platform 20 comprising two upper side frame members 34a, in parallel relationship with each other, which extend between two end frame members 36 and are firmly joined thereto. In like manner there is shown two lower side frame members 34b, in parallel relationship with each other, which also extend between end frame members 36 and are firmly joined thereto. To provide further rigidity to platform 20, longitudinal beams 38 are provided to likewise extend between end frame members 36, in parallel spaced-apart relationship with side frame members 34a. Lateral stiffeners 40 are positioned at intervals along side frame members 34a and 34b, in parallel relationship with end frame members 36, and are firmly joined to each of the side frame members 34a and 34b and longitudinal beams 38. Magnet crossbeams 42, positioned between side frame members 34 in parallel relationship with one another, receive the weight of MR system 10a and distribute the weight to other platform 20 components. Two magnet mounting plates 44 are placed on each magnet crossbeam 42, and are respectively positioned to receive the four legs 14 of MR system 10a. Each magnet mounting plate is provided with a bolt hole 44a for use in securely bolting the legs 14 to the crossbeams 42.

While only a portion is shown in FIG. 3, the top mounting plate 46 extends across the top of platform 20, over an area defined by the joined side frame members 34a and end frame members 36. Usefully, such area is on the order of 8 feet by 20 feet. End frame members 36 and lateral stiffeners 40 respectively comprise channels which extend upwardly from side frame members 34a, as viewed in FIG. 2. Top mounting plate 46 is firmly joined thereto.

Figure 4:
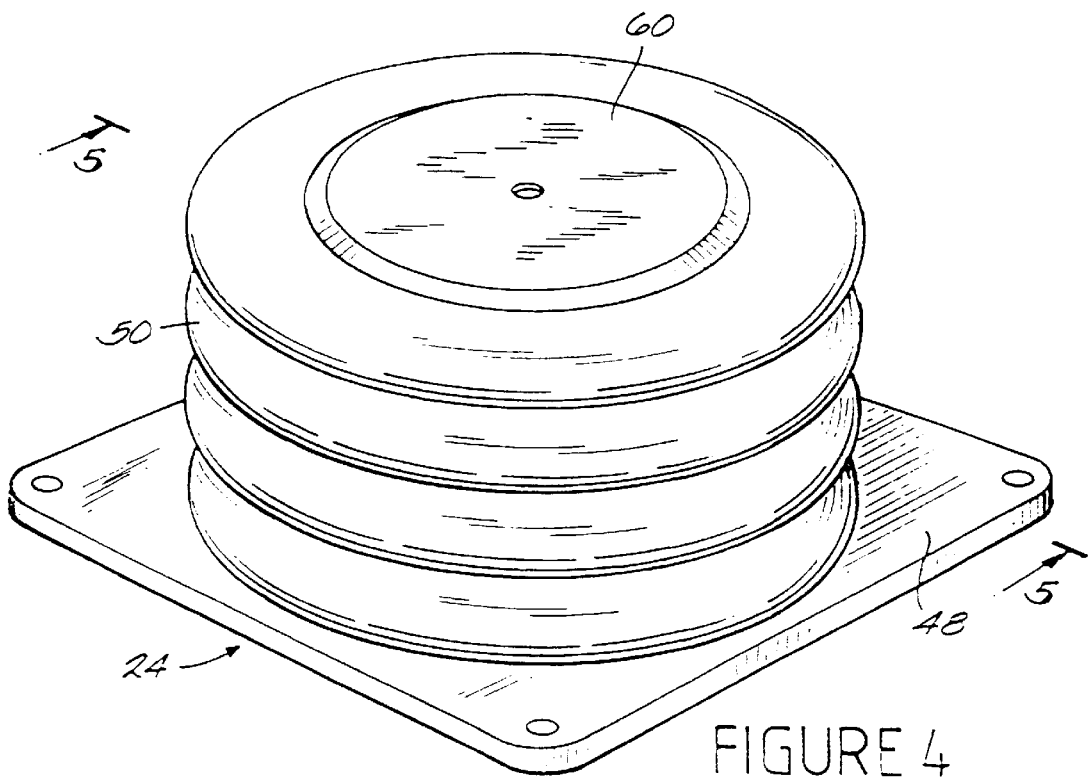
FIG. 4 is a perspective view showing a vibration isolation element for the embodiment of FIG. 1.
Figure 5:
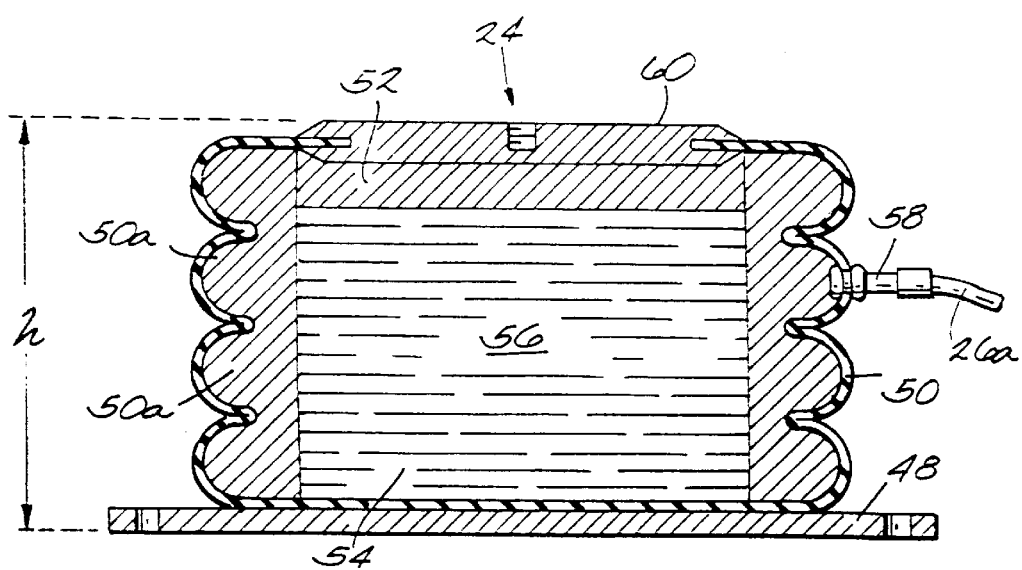
FIG. 5 is a sectional view taken along lines 5—5 of FIG. 4.

Referring to FIGS. 4 and 5 together, there is shown an isolation element 24 generally comprising a metal base plate 48 and a cylindrical side wall 50. Side wall 50, as well as a top wall member 52 joined thereto as an integral structure, are formed of the compliant material as stated above. Side wall 50, top wall member 52 and base plate 48 together form an air-tight enclosure 54, which is disposed to retain a quantity of air 56 under pressure. Air enters enclosure 54 from an air line 26a, as described above, through a valve stem 58. The air pressure level within enclosure 54 is maintained by air pressure regulator 26, as likewise described above.

Referring further to FIGS. 4 and 5, there is shown a steel load bearing plate 60 embedded in top wall member 52. Load bearing plate 60 is disposed to contact the underside of platform 20, to carry a portion of the weight thereof. The height h of isolation element 24, measured from base plate 48 to the upper side of load bearing plate 60, may be adjusted by varying the air pressure within enclosure 54, as described above.

FIGS. 4 and 5 further show sidewall 50 formed to comprise a number of annular ridges 50a, which are in a vertically stacked relationship. The ridges 50a enhance the vertical and lateral stability of an isolation element 24, so that the isolation element is very effective in preventing transmission of vibrations between base plate 48 and load bearing plate 60.

Obviously, many other modifications and variations of the present invention are possible in light of the above teachings. It is therefore to be understood that within the scope of the disclosed concept, the invention may be practiced otherwise than as has been specifically described.

What is claimed is:

1. Apparatus for providing vibration isolation between an MR imaging system and an associated nominally horizontal support surface, said apparatus comprising:
    a stiff platform of selectively substantial mass which is provided with a bearing surface and disposed to carry the weight of said MR imaging system;
    a number of vibration isolation elements positioned to support said platform and said MR imaging system upon said horizontal support surface in selected spaced apart relationship therewith, each of said isolation elements comprising an enclosure for air under pressure which is disposed to dampen vibrations applied thereto;
    a number of sensors selectively joined to said apparatus for detecting vibrations between said MR imaging system and said support surface, and for detecting degradation of MR imaging; and
    a pressure regulator coupled to respective isolation elements to maintain specified air pressure levels therein whereby vibrations between said MR imaging system and said support surface are dampened and MR imaging degradation is minimized.

2. The apparatus of claim 1 wherein:
    each of said isolation elements comprises a side wall member formed of resilient material and an upper load bearing plate disposed to engage said platform, the bearing plate of a given isolation element being positioned at a height above said horizontal support surface which is determined by the air pressure within said given isolation element.

3. The apparatus of claim 2 wherein:
    said pressure regulator monitors the air pressure level within each of said isolation elements, and adjusts each of said air pressure levels to maintain said platform at a specified height and orientation with respect to said horizontal support surface.

4. The apparatus of claim 2 wherein:
    said platform has a mass of about 10,000 pounds.

5. The apparatus of claim 2 wherein:
    each of said isolation elements is disposed to oppose vibrations having components of motion which are oriented in both vertical and horizontal planes.

6. The apparatus of claim 2 wherein said apparatus further comprises:
    a vibration generator adapted for placement on said platform to apply mechanical vibrations of selected amplitudes and frequencies to said MR imaging system.

7. The apparatus of claim 6 wherein:
    said vibration generator comprises an electrodynamic shaker which is operable to provide mechanical vibrations of varying amplitude and frequency, and each of said vibrations sensors comprises an accelerometer.

8. The apparatus of claim 3 wherein:
    said pressure regulator is disposed to adjust the air pressure levels in each of said isolation elements to maintain said platform in a horizontal plane, to a specified level of precision.

9. An MR vibration isolation system for use on a substantially horizontal support surface, said MR vibration isolation system comprising:
    an MR imaging system;
    a rigid platform disposed to carry the weight of said MR imaging system said platform having a mass which is at least substantially the same as the mass of said MR imaging system;
    a number of vibration isolation elements for supporting said platform and said MR imaging system upon said horizontal support surface, each of said vibration isolation elements comprising an enclosure for air under pressure which is disposed to dampen vibrations applied thereto; and
    a pressure regulator coupled to respective vibration isolation elements to maintain specified air pressure levels therein whereby vibrations between aid MR imaging system and said support surface are dampened and MR imaging degradation is minimized.

10. The MR vibration isolation system of claim 9 wherein:
    said platform is provided with substantial mass and with a bearing surface sized to receive said MR imaging system.

11. The MR vibration isolation system of claim 9 wherein:
    said pressure regulator is disposed to adjust the air pressure levels in each of said isolation elements to maintain said platform in a horizontal plane, to a specified level of precision.

12. The MR vibration isolation system of claim 9 wherein:
    each of said vibration isolation elements is provided with a side wall member formed of resilient material and with an upper load bearing plate disposed to engage said platform, the bearing plate of a given isolation element being positioned at a height above said horizontal support surface which is determined by the air pressure within said given isolation element.

13. The MR vibration isolation system of claim 12 wherein:
    each of said isolation elements is disposed to provide both vertical and lateral stability to said MR imaging system.

14. The MR vibration isolation system of claim 9 wherein said MR vibration isolation system further comprises:
    a vibration generator adapted for placement on said platform to apply mechanical vibrations of selected amplitudes and frequencies to said MR imaging system; and
    a number of vibration sensors selectively joined to said MR imaging system to determine effects of said applied vibrations on the operation of said MR imaging system.

15. A method for selectively providing vibration isolation between an MR imaging system and an associated horizontal support surface comprising the steps of:
    mounting said MR imaging system on a specified vibration barrier comprising a stiff platform of substantial mass and a number of vibration isolation elements positioned to support said platform on said horizontal support surface, said platform being adapted to carry the weight of said MR imaging system, and each of said isolation elements comprising an enclosure for air under pressure which is disposed to dampen vibrations applied thereto;
    acquiring data from a plurality of vibration sensors attached to said MR imaging system, said data representing degradation of MR images; and
    maintaining a specified air pressure level in each of said isolation elements, as required to dampen vibrations and minimize degradation of MR images.

16. The method of claim 15 wherein said method comprises the further steps of:

controllably applying vibrations of varying amplitudes and frequencies to said MR imaging system through said platform.

17. The method of claim 16 wherein the step of acquiring data comprises:

acquiring a first set of data from a plurality of vibration sensors attached to said MR imaging system, said first set of data representing degradation of MR images produced by said MR imaging system which is caused by said controllably applied vibrations; and acquiring a second set of data from a plurality of vibration sensors attached to said MR imaging system, said second set of data representing degradation of MR images produced by said MR imaging system which is caused by said operational site vibrations transmitted to said MR imaging system; and wherein said method comprises the further steps of:

placing said MR imaging system upon a horizontal support surface located at an operational site so that vibrations present at said operational site may be transmitted to said MR imaging system;

comparing data of said first and second data sets to determine whether degradation of MR images caused by said operational site vibrations exceeds a prespecified level; and mounting said MR imaging system to said operational site on a vibration barrier which is substantially identical to said specified vibration barrier in the event degradation of MR images caused by said operational site vibrations exceeds said prespecified level.

18. The method of claim 16 wherein:

vibrations are controllably applied to said MR imaging system by means of an electrodynamic shaker, and said first set of data is acquired by means of a plurality of accelerometers attached to said MR imaging system.

19. The method of claim 15 wherein:

said specified air pressure level is maintained in each of said isolation elements by means of a pressure regulator coupled thereto.

20. The apparatus of claim 1 wherein at least one sensor is an accelerometer.

21. The apparatus of claim 1 wherein the pressure regulator is coupled to respective isolation elements in order to maintain said platform in selected spaced-apart relationship with said horizontal support surface.

22. The MR vibration isolation system of claim 9 wherein the pressure regulator is coupled to respective isolation elements in order to maintain said platform in selected spaced-apart relationship with said horizontal support surface.

* * * * *